(12) United States Patent
Yanka et al.

(10) Patent No.: US 9,768,339 B2
(45) Date of Patent: Sep. 19, 2017

(54) OPTOELECTRONIC DETECTORS HAVING A DILUTE NITRIDE LAYER ON A SUBSTRATE WITH A LATTICE PARAMETER NEARLY MATCHING GAAS

(71) Applicant: IQE, plc, St. Mellons, Cardiff (GB)

(72) Inventors: Robert Yanka, Kernersville, NC (US);
Seokjae Chung, Oak Ridge, NC (US);
Kalyan Nunna, High Point, NC (US);
Rodney Pelzel, Emmaus, PA (US);
Howard Williams, Cardiff (GB)

(73) Assignee: IQE, plc, St. Mellons, Cardiff (GB)

(*) Notice: Subject to any disclaimer, the term of this patent is extended or adjusted under 35 U.S.C. 154(b) by 0 days.

(21) Appl. No.: 15/188,396

(22) Filed: Jun. 21, 2016

(65) Prior Publication Data

US 2016/0372624 A1 Dec. 22, 2016

Related U.S. Application Data

(60) Provisional application No. 62/183,060, filed on Jun. 22, 2015.

(51) Int. Cl.
*H01L 31/00* (2006.01)
*H01L 31/107* (2006.01)
(Continued)

(52) U.S. Cl.
CPC .... *H01L 31/1075* (2013.01); *H01L 31/03044* (2013.01); *H01L 31/03046* (2013.01); *H01L 31/03048* (2013.01); *H01L 31/105* (2013.01); *H01L 31/1848* (2013.01); *H01L 31/1852* (2013.01); *Y02E 10/544* (2013.01)

(58) Field of Classification Search
CPC .......... H01L 31/1075; H01L 31/03046; H01L 31/03044; Y02E 10/544
See application file for complete search history.

(56) References Cited

U.S. PATENT DOCUMENTS 4,127,862 A * 11/1978 Ilegems ............... G02B 6/4202
136/249
4,682,196 A * 7/1987 Sakai .............. H01L 31/035281
257/458

(Continued)

OTHER PUBLICATIONS

Takeda et al., "Electron mobility and energy gap of In0.53 Ga0.47As on InP substrate", 1976, Journal of Applied Physics, vol. 47, No. 12, p. 5405-5408, published Dec. 1976.*

(Continued)

*Primary Examiner* — Nikolay Yushin
(74) *Attorney, Agent, or Firm* — Haley Guiliano LLP

(57) ABSTRACT

Optoelectronic detectors having one or more dilute nitride layers on substrates with lattice parameters matching or nearly matching GaAs are described herein. A semiconductor can include a substrate with a lattice parameter matching or nearly matching GaAs and a first doped III-V layer over the substrate. The semiconductor can also include an absorber layer over the first doped III-V layer, the absorber layer having a bandgap between approximately 0.7 eV and 0.95 eV and a carrier concentration less than approximately $1\times10^{16}$ cm$^{-3}$ at room temperature. The semiconductor can also include a second doped III-V layer over the absorber layer.

28 Claims, 9 Drawing Sheets

(51) Int. Cl.
*H01L 31/0304* (2006.01)
*H01L 31/105* (2006.01)
*H01L 31/18* (2006.01)

(56) References Cited

U.S. PATENT DOCUMENTS

| | | | | |
|---|---|---|---|---|
| 7,045,833 | B2* | 5/2006 | Campbell | H01L 31/107 257/185 |
| 8,093,559 | B1* | 1/2012 | Rajavel | H01L 31/03046 250/330 |
| 8,575,473 | B2 | 11/2013 | Jones et al. | |
| 8,957,376 | B1 | 2/2015 | Tkachuk et al. | |
| 2003/0047752 | A1* | 3/2003 | Campbell | H01L 31/107 257/186 |
| 2009/0014061 | A1 | 1/2009 | Harris et al. | |
| 2010/0072457 | A1* | 3/2010 | Iguchi | B82Y 20/00 257/21 |

OTHER PUBLICATIONS

Cheah et al., "GaAs-Based Heterojunction p-i-n Photodetectors Using Pentanary InGaAsNSb as the Intrinsic Layer," *IEEE Photonics Technology Letters*, vol. 17, No. 9, Sep. 2005, 3 pages.

Chen, et al., "GaAsSbN/GaAs long wavelength PIN detectors," *Indium Phosphide and Related Materials*, 2008. IPRM 2008. 20th International Conference on, Versailles, 2008, 4 pages.

Ferguson et al., "Optical Gain in GaInNAs and GaInNAsSb Quantum Wells," *IEEE Journal of Quantum Electronics*, vol. 47, No. 6, Jun. 2011, 8 pages.

Gobet et al., "GaInNAsSb/GaAs vertical cavity surface-emitting lasers (VCSELs): Current challenges and techniques to realize multiple-wavelength laser arrays at 1.55 μm.," *Proc. of SPIE*, vol. 6908, Feb. 2008, 13 pages.

Harris et al., Development of GaInNAsSb alloys: Growth, band structure, optical properties and applications, *Phys. Stat. Sol.* (b) 244, No. 8, 2707-2729 (2007), 23 pages.

Harris, J. S. Jr., "The opportunities, successes and challenges for GaInNAsSb," *Journal of Crystal Growth 278* (2005) Mar. 2, 2005, 15 pages.

Jackrel et al., "Thick lattice-matched GaInNAs films in photodetector applications," *Proc. of SPIE*, vol. 5726, (2005), 8 pages.

Khalil et al., "Photoconductivity and photoluminescence under bias in GaInNAs/GaAs MQW p-i-n structures," *Nanoscale Research Letter*, 7:539 (2012), 4 pages.

Ng et al., "Long wavelength bulk GaInNAs p-i-n photodiodes lattice matched to GaAs," *Journal of Applied Physics 101*, (2007), 6 pages.

Niu et al., "GaAs-based room-temperature continuous-wave 1.59 μm GaInNAsSb single-quantum-well laser diode grown by molecular-beam epitaxy," *Applied Physics Letters*, Dec. 5, 2005, vol. 87 No. 23, 4 pages.

Ohnaka et al., "A Low Dark Current InGaAs/InP p-i-n Photodiode with Covered Mesa Structure," *IEEE Transactions on Electron Devices*, vol. Ed-34, No. 2, Feb. 1987, 6 pages.

Ptak et al., "Effects of temperature, nitrogen ions, and antimony on wide depletion width GaInNAs," *Journal of Vacuum Sience & Technology B*, Second Series, vol. 25, No. 3, May/Jun. 2007, 6 pages.

Tan et al., "Dilute nitride GaInNAs and GaInNAsSb for solar cell applications," *Proc. of SPIE*, vol. 8256 (2012), 10 pages.

Tan et al., "GaInNAsSb/GaAs Photodiodes for Long-Wavelength Applications," *IEEE Electron Device Letters* vol. 32 No. 7, Jul. 2011, 3 pages.

Tan et al., "Reduction of dark current and unintentional background doping in InGaAsN photodetectors by ex situ annealing," *Proc. of SPIE*, vol. 7726, (2010), 8 pages.

Wistey et al., "Monolithic, GaInNAsSb VCSELs at 1.46 μm on GaAs by MBE," *Electronics Letters*, Dec. 11, 2003, vol. 39, No. 25, 2 pages.

Yuen et al., "The role of antimony on properties of widely varying GaInNAsSb compositions," *Journal of Applied Physics 99*, (2006), 8 pages.

Baribeau et al., "Heteroepitaxy of Ge on (100) Si substrates," *Journal of Vacuum Science & Technology*, A 5 (4), Jul./Aug. 1987 (6 pages).

Dargis et al., "Growth and application of epitaxial heterostructures with polymorphous rare-earth oxides," *Journal of Crystal Growth*, 378 (2013) 177-179.

International Search Report and Written Opinion dated Oct. 4, 2016 in PCT/US2016/038567, filed Jun. 21, 2016 (15 pages).

Bank et al., "Low-Threshold Continuous-Wave 1.5-μm GaInNAsSb Lasers Grown on GaAs," *IEEE Journal of Quantum Electronics*, vol. 40 No. 6 (2004) 9 pages.

Jackrel, "InGaAs and GaInNAs(Sb) 1064 NM Photodetectors and Solar Cells on GaAs Substrates," (2005) 264 pages.

Jackrel et al., "Dilute nitride GaInNAs and GaInNAsSb solar cells by molecular beam epitaxy," *Journal of Applied Physics* 101, 114916 (2007) 9 pages.

Kim et al., "Characteristics of bulk InGaAsN and InGaAsSbN materials grown by metal organic vapor phase epitaxy (MOVPE) for solar cell application," *Proc. of SPIE*, vol. 8256, (2012) 8 pages.

Ng et al., "Molecular beam epitaxy growth of bulk GaNAsSb on Ge/graded-SiGe/Si substrate," *Journal of Crystal Growth 311*, pp. 1754-1757 (2009).

Sin et al., "Carrier Dynamics in MOVPE-Grown Bulk Dilute Nitride Materials for Multi-Junction Solar Cells," *Proc. of SPIE*, vol. 7933, (2011) 11 pages.

Tan et al., "Molecular beam epitaxy grown GaNAsSb 1 eV photovoltaic cell," *Journal of Crystal Growth* 335 (2011) pp. 66-69.

Yuen, "Growth and Characterization of Dilute Nitride Antimonides for Long-Wavelength Optoelectronics," a Dissertation submitted to the department of materials science and engineering and the committee on graduate studies of Stanford University in partial fulfillment of the requirements for the degree of doctor of philosophy, Mar. 2006, 203 pages.

\* cited by examiner

OPTOELECTRONIC DETECTORS HAVING A DILUTE NITRIDE LAYER ON A SUBSTRATE WITH A LATTICE PARAMETER NEARLY MATCHING GAAS

CROSS REFERENCE TO RELATED APPLICATIONS

This application claims priority to U.S. Provisional Application Ser. No. 62/183,060, filed Jun. 22, 2015, the entire contents of which are hereby incorporated by reference.

BACKGROUND

III-V materials are the materials of choice for fabricating optoelectronic emitters and detectors for a variety of applications. One reason for this is that the bandgap of the material can be chosen for the specific wavelength of interest. Fiber optic systems typically use the 1.33 μm (micrometer) and 1.50 μm wavelengths because of their transmission characteristics.

Historically, the vast majority of 1.33 μm and 1.50 μm emitters and detectors employ indium gallium arsenide (InGaAs) alloys as the emitting and detecting medium. To generate high quality InGaAs needed for an emitter or detector, it is preferred that the material be as free as possible of crystalline defects. The alloy composition and thickness of the InGaAs layers needed for functional devices necessitates growth on an indium phosphide (InP) substrate since InP has the same in-plane lattice parameter as $In_{0.53}Ga_{0.47}As$ (Eg=0.75 eV at 300 K which corresponds to a wavelength of 1.65 μm).

From a cost perspective, it would be preferable to grow optoelectronic detectors and emitters on a less expensive substrate than InP, such as gallium arsenide (GaAs), germanium (Ge), or silicon (Si). However, the lattice mismatch between less expensive substrates and InGaAs alloys of desired composition results in highly defective material when grown sufficiently thick to fabricate a viable detector or emitter. Substrate cost is a significant portion of overall manufacturing cost, and therefore, finding a route to grow a material of sufficient bandgap on a less expensive substrate is of significant technical and practical interest.

SUMMARY

Optoelectronic detectors having one or more dilute nitride layers on substrates with lattice parameters matching or nearly matching GaAs are described herein. A semiconductor can include a substrate with a lattice parameter matching or nearly matching GaAs and a first doped III-V layer over the substrate. The semiconductor can also include an absorber layer over the first doped III-V layer, the absorber layer having a bandgap between approximately 0.7 eV and 0.95 eV and a carrier concentration less than approximately $1 \times 10^{16}$ cm$^{-3}$ at room temperature. The semiconductor can also include a second doped III-V layer over the absorber layer.

The absorber layer can include a dilute nitride. The dilute nitride can include $In_xGa_{1-x}N_yAs_{1-y-z}Sb_z$, with x, y, and z falling within the following respective ranges: (0≤x≤1; 0≤y≤1; 0≤z≤1). In some examples, x, y, and z can fall within the following respective ranges: (0≤x≤0.55; 0≤y≤0.1; 0≤z≤0.1).

The carrier concentration of the absorber layer can be less than approximately $5 \times 10^{15}$ cm$^{-3}$, or it can be less than approximately $1 \times 10^{15}$ cm$^{-3}$. The thickness of the absorber layer can be between approximately 2 micrometers and approximately 10 micrometers, or it can be between approximately 3 micrometers and approximately 5 micrometers.

The semiconductor can further include a multiplication layer between the absorber layer and one of the first and second doped III-V layers.

One or more implementations can result in a substrate with a lattice parameter matching or nearly matching GaAs. The substrate can include GaAs. The substrate can include a silicon substrate and a lattice engineered layer over the silicon substrate, with the surface of the lattice engineered layer opposite the silicon substrate having a lattice parameter that is matched or nearly matched to GaAs. The lattice engineered layer can include a $Si_xGe_{1-x}$ layer, with x graded from 1 at a surface of the $Si_xGe_{1-x}$ layer nearest the silicon substrate to 0 at a surface of the $Si_xGe_{1-x}$ layer opposite the silicon substrate. The lattice engineered layer can include a rare earth containing layer, with the rare earth containing layer including one or more of Sc, Y, La, Ce, Pr, Nd, Pm, Sm, Eu, Gd, Tb, Dy, Ho, Er, Tm, Yb, and/or Lu.

The first doped III-V layer can be n-type and the second doped III-V layer can be p-type. The first doped III-V layer can be p-type and the second doped III-V layer can be n-type.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

Figure 1:
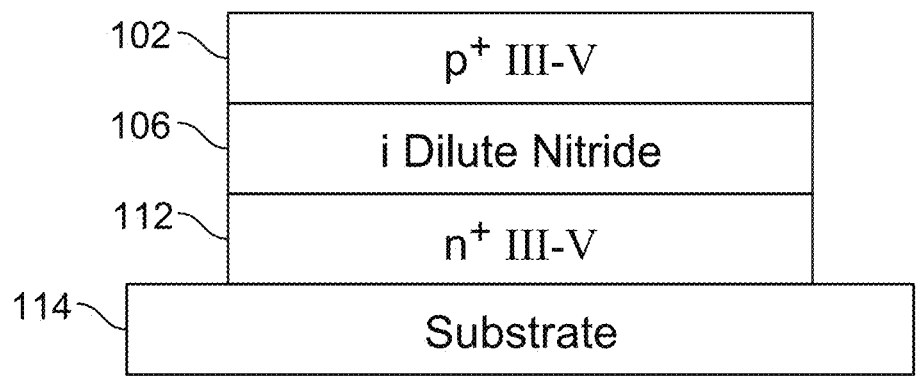
FIG. 1 depicts a semiconductor comprising a p-i-n diode, according to an illustrative implementation.

Systems and methods described herein include processes for the growth of high quality optoelectronic detectors on a substrate with a lattice parameter matching or nearly matching GaAs. Detectors described herein use a dilute nitride layer, typically an $In_xGa_{1-x}N_yAs_{1-y-z}Sb_z$ layer as the absorbing medium, where x ranges from 0 to 0.55, y ranges from 0 to 0.1, and z ranges from 0 to 0.1, herein referred to as the InGaNAsSb layer. The dilute nitride is a III-V material that includes low concentrations of nitrogen, concentrations that are low alloy-level concentrations and are higher than doping-level concentrations. The dilute nitride layer may have trace amounts of dopants or contamination, but in amounts that do not prevent the layer from functioning in a detector. In some examples the optoelectronic detectors use a p-i-n structure. In a typical p-i-n, the absorption medium is an intrinsic semiconductor (i) is sandwiched between an n-type semiconductor and a p-type semiconductor. The n-type region has electrons as the majority carrier, usually due to doping by donor dopants. The p-type region has holes as the majority carrier, usually due to doping by acceptor dopants. In operation, the diode is reverse biased which serves to "sweep" out carriers generated by photons of sufficient energy.

The substrate with a lattice parameter matching or nearly matching GaAs may comprise a GaAs substrate, a Ge substrate, or a lattice engineered substrate. Examples of lattice engineered substrates include a substrate comprising a graded SiGe layer on a Si handle wafer and a substrate comprising a rare-earth containing layer on a Si handle wafer. The lattice parameter is a dimension of a unit cell in a crystal lattice. The substrate with a lattice parameter matching or nearly matching GaAs may have a lattice parameter that is the same as or slightly different than the lattice parameter of GaAs (5.65 Å), but is similar enough that high-quality GaAs can be epitaxially grown on the substrate surface. High quality GaAs can include a defect level that is comparable to or lower than a defect level of an $In_{0.53}Ga_{0.47}As$ layer grown on an InP substrate. This can mean the substrate has a lattice parameter different than that of GaAs by less than or equal to 3%, less than 1%, or less than 0.5%.

An InGaNAsSb absorber layer of high quality enables low cost, high performance detectors. One reason for this is that the absorber layer can be grown coherently (i.e., crystalline, non-relaxed and with minimal defectivity) on a substrate with a lattice parameter matching or nearly matching GaAs. The composition of the InGaNAsSb layer can be tuned so that a layer of desired bandgap and thickness can be coherently grown on a substrate with a lattice parameter matching or nearly matching GaAs with minimal defects. The bandgap is the energy difference between conduction and valence bands of a material, and can be direct (where electronic transitions between the bands can occur with only emission or absorption of a photon) or indirect (where electronic transitions between the bands require emission or absorption of a phonon in addition to emission or absorption of a photon). III-V materials generally have direct bandgaps, but the layers described herein can have direct or indirect bandgaps.

FIG. 1 depicts a semiconductor 100 comprising a p-i-n diode. The semiconductor 100 includes a substrate 114, an $n^+$ III-V layer 112 epitaxially formed over the substrate 114, an intrinsic dilute nitride layer 106 epitaxially formed over the $n^+$ III-V layer 112, and a $p^+$ III-V layer 102 epitaxially formed over the dilute nitride layer 106.

The III-V layers 102 and 112 can include any III-V material, such as GaAs, InGaAs, AlGaAs, InGaP, InGaAsP, InGaAsN, InGaNAsSb, or another III-V material. The substrate 114 can be a semiconducting, conducting, or an insulating substrate. The upper surface of the substrate 114 has a lattice parameter that matches or nearly matches GaAs. Examples of the substrate 114 are described below with reference to FIG. 16. The dilute nitride layer 106 is an intrinsic layer in the p-i-n diode and serves as an absorption medium. The terms absorber layer and absorption medium can be used to describe any layer that absorbs photons.

The dilute nitride layer 106 has a lattice parameter that is compatible with the III-V layers 102 and 112. The dilute nitride layer 106 can be lattice-matched to the III-V layers 102 and 112, or it may have a lattice parameter that is relatively close (nearly matched) to the III-V layers 102 and 112. Thus, the dilute nitride layer 106 has a sufficiently low defect level such that it has good optical performance. Such a sufficiently low defect level can include a comparable or lower defect level than would occur in an $In_{0.53}Ga_{0.47}As$ layer grown on an InP substrate. Each of the layers 102, 106, and 112 and the substrate 114 can include one or more layers that improve lattice-matching, interface quality, electron transport, hole transport and/or other optoelectronic properties.

Figure 2:
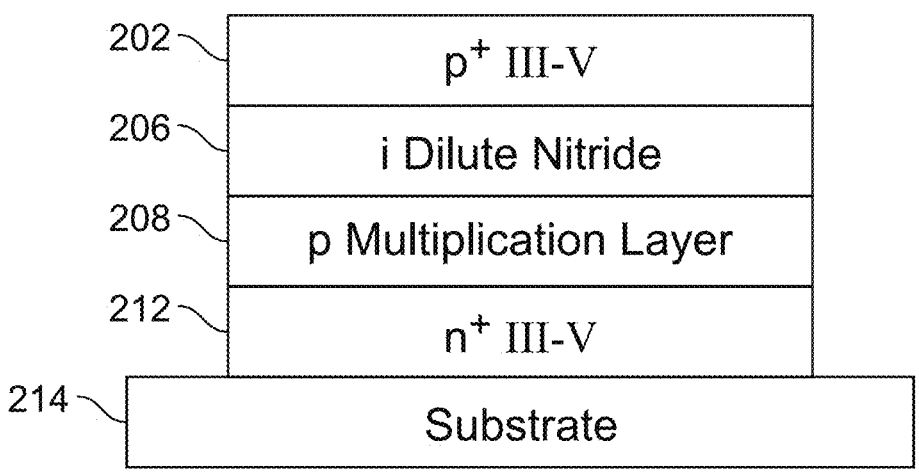
FIG. 2 depicts a semiconductor with a p-i-n diode and a multiplication layer, according to an illustrative implementation.

FIG. 2 depicts a semiconductor 200 with a p-i-n diode and a multiplication layer. The semiconductor 200 is similar to the semiconductor 100, but also includes a multiplication layer to amplify the photocurrent generated by the intrinsic layer of the p-i-n diode. The structure of the semiconductor 200 can be described as an avalanche photodiode (APD) structure. In an APD, the addition of the multiplication layer results in an additional p-i-n or p-n junction. This allows a higher reverse bias to be applied, resulting in carrier multiplication via the avalanche process. As a result the gain (number of electrons per photon) of the device (as compared to a standard p-i-n) is increased. This results in a higher sensitivity device. The semiconductor 200 includes a substrate 214, an $n^+$ III-V layer 212 epitaxially formed over the substrate 214, a p-type multiplication layer 208 formed over the $n^+$ III-V layer 212, an intrinsic dilute nitride layer 206 epitaxially formed over the p-type multiplication layer 208, and a p+ III-V layer 202 epitaxially formed over the dilute nitride layer 206.

The III-V layers 202 and 212 can include any III-V material, such as GaAs, InGaAs, AlGaAs, InGaP, InGaAsP, InGaAsN, InGaNAsSb, or another III-V material. The substrate 214 can be a semiconducting, conducting, or an insulating substrate. The upper surface of the substrate 214 has a lattice parameter that matches or nearly matches GaAs. Examples of the substrate 214 are described below with reference to FIG. 16. The dilute nitride layer 206 is an intrinsic layer in the p-i-n diode and serves as an optical absorber layer.

The dilute nitride layer 206 has a lattice parameter that is compatible with the III-V layers 202 and 212. The dilute nitride layer 206 can be lattice-matched to the III-V layers 202 and 212, or it may have a lattice parameter that is relatively close (nearly matched) to the III-V layers 202 and 212. Thus, the dilute nitride layer 206 has a sufficiently low defect level such that it has good optical performance. Such a sufficiently low defect level can include a comparable or lower defect level than would occur in an $In_{0.53}Ga_{0.47}As$ layer grown on an InP substrate. Each of the layers 202, 206, and 212 and the substrate 214 can include one or more layers that improve lattice-matching, interface quality, electron transport, hole transport and/or other optoelectronic properties.

The multiplication layer 208 can be a p-type III-V layer that amplifies the current generated by the dilute nitride layer 206 through avalanche multiplication. Thus, for each free carrier (electron or hole) generated by the dilute nitride layer 206, the multiplication layer 208 generates one or more carriers via the avalanche effect. Thus, the multiplication layer 208 increases the total current generated by the semiconductor 200.

Figure 3:
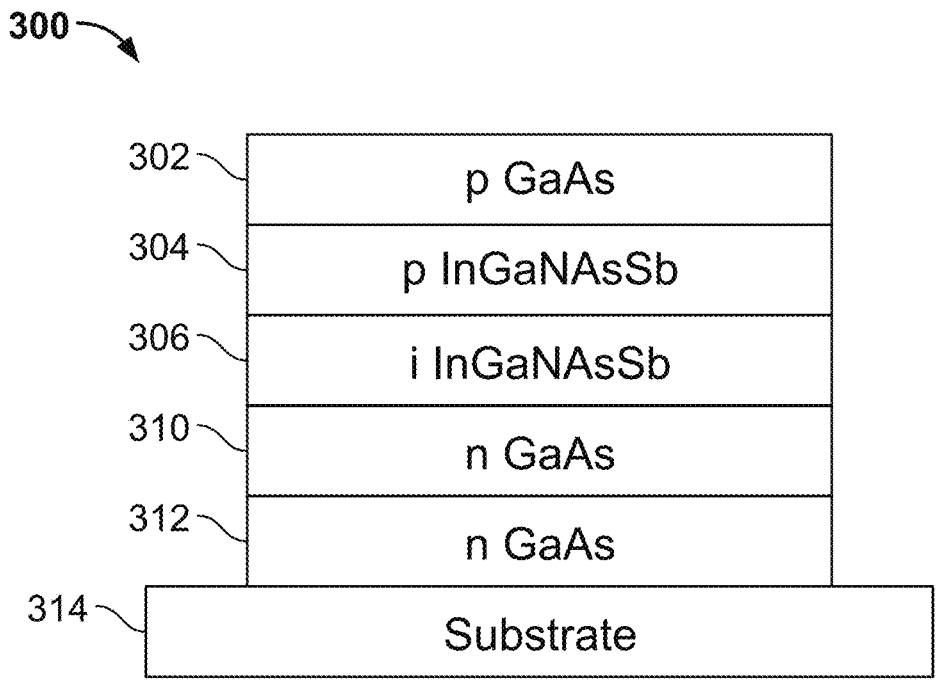
FIG. 3 depicts a semiconductor with a GaAs-based p-i-n diode, according to an illustrative implementation.

FIG. 3 depicts a semiconductor 300 with a GaAs-based p-i-n diode. The semiconductor 300 includes a substrate 314 with a top surface having a lattice parameter matching or nearly matching that of GaAs. The substrate 300 includes an n-type GaAs layer 312 epitaxially formed over the substrate 314, and an n-type GaAs layer 310 epitaxially formed over the GaAs layer 312. The GaAs layer 312 can be more heavily doped than the GaAs layer 310. The semiconductor 300 also includes an intrinsic InGaNAsSb layer 306 epitaxially formed over the GaAs layer 310, a p-type InGaNAsSb layer 304 epitaxially formed over the intrinsic InGaNAsSb layer 306, and a p-type GaAs layer 302 epitaxially formed over the p-type InGaNAsSb layer 304. The p-type GaAs layer 302 can be more heavily doped than the p-type InGaNAsSb layer 304. The InGaNAsSb layer 304 and the InGaNAsSb layer 306 can each have the composition $In_xGa_{1-x}N_yAs_{1-y-z}Sb_z$ ($0 \leq x \leq 1$; $0 \leq y \leq 1$; $0 \leq z \leq 1$). The mole fractions x, y, and z can have different values in the different layers 302 and 304. In some examples, x ranges from 0 to 0.55, y ranges from 0 to 0.1, and z ranges from 0 to 0.1.

In some examples, the p-type GaAs layer 302 can have a thickness of approximately 0.2 μm and can be doped with Be or C to result in a free hole concentration of approximately $1.5 \times 10^{19}$ cm$^{-3}$. The p-type InGaNAsSb layer 304 can have a thickness of approximately 0.25 μm and can be doped with Be or C to result in a free hole concentration of approximately $7 \times 10^{18}$ cm$^{-3}$. The composition of the InGaNAsSb layer 304 can be selected to result in a bandgap of approximately 0.8 eV. The InGaNAsSb layer 306 can have a thickness of approximately 3 μm and can be unintentionally doped (UID) with a free carrier concentration of approximately $6 \times 10^{14}$ cm$^{-3}$. The carrier concentration of a material is the number density of charge carriers such as electrons or holes in the material. The carrier concentration of a material is sometimes expressed in units of electrons-cm$^{-3}$, holes-cm$^{-3}$, or atoms-cm$^{-3}$ (referring to the atomic dopant density), but more often, the name of the particle is omitted while referencing the same quantity and the carrier concentration is simply expressed in units of cm$^{-3}$. UID semiconductors do not have dopants that were intentionally added, but can include a nonzero concentration of impurities that act as dopants. The InGaNAsSb layer 306 can act as an absorber layer to absorb incident photons. The InGaNAsSb layer 306 can have primarily holes as the free carriers, making the layer 306 p-type. The composition of the InGaNAsSb layer 306 can also be selected to result in a bandgap of approximately 0.8 eV. The InGaNAsSb layer 306 can have a bandgap between approximately 0.8 eV and approximately 0.95 eV, corresponding to wavelengths between 1.3 μm and 1.55 μm.

With the appropriate concentration of In, InGaAs alloys can have bandgaps within the wavelength range 1.3-1.55 μm. However, the lattice parameters of such InGaAs alloys are similar to that of InP, but not that of GaAs or Si. Thus, InGaAs absorbers are not readily compatible with epitaxial growth on GaAs or silicon substrates. However, the addition of N to InGaAs can reduce the bandgap while resulting in a lattice parameter that matches or nearly matches GaAs. Addition of Sb to InGaNAs results in improved crystallinity and lower background carrier concentration for a given bandgap. Sb can mitigate some defect types or can act as a surfactant to enhance device performance. Sb can improve the incorporation of N, allowing a lower N flux or flow to be used to grow a material of a given N concentration and correspondingly bandgap, thus reducing the background carrier concentration. Accordingly, the bandgap of InGaNAsSb can be tailored to the appropriate range while maintaining good crystallinity and lattice matching to GaAs.

The GaAs layer 310 can have a thickness of approximately 0.5 μm and can be doped with silicon to result in an n-type material with a free carrier concentration of approximately $2 \times 10^{15}$ cm$^{-3}$. The GaAs layer 312 can have a thickness of approximately 2.5 μm and can be doped with silicon to result in an n-type material with a free carrier concentration of approximately $5 \times 10^{18}$ cm$^{-3}$. The substrate 314 can include one or more layers, and the top surface of the substrate can have a lattice parameter matching or nearly matching GaAs. This results in a high quality interface between the GaAs layer 312 and the substrate 314, and reduces defect levels in the semiconductor 300. Some examples of the substrate 314 are described below with reference to FIG. 16. Accordingly, the semiconductor 300 includes a GaAs-based p-i-n diode that is optically active in the 1.3-1.55 μm range and is formed on the top surface of a substrate with a lattice parameter matching or nearly matching that of GaAs.

Figure 4:
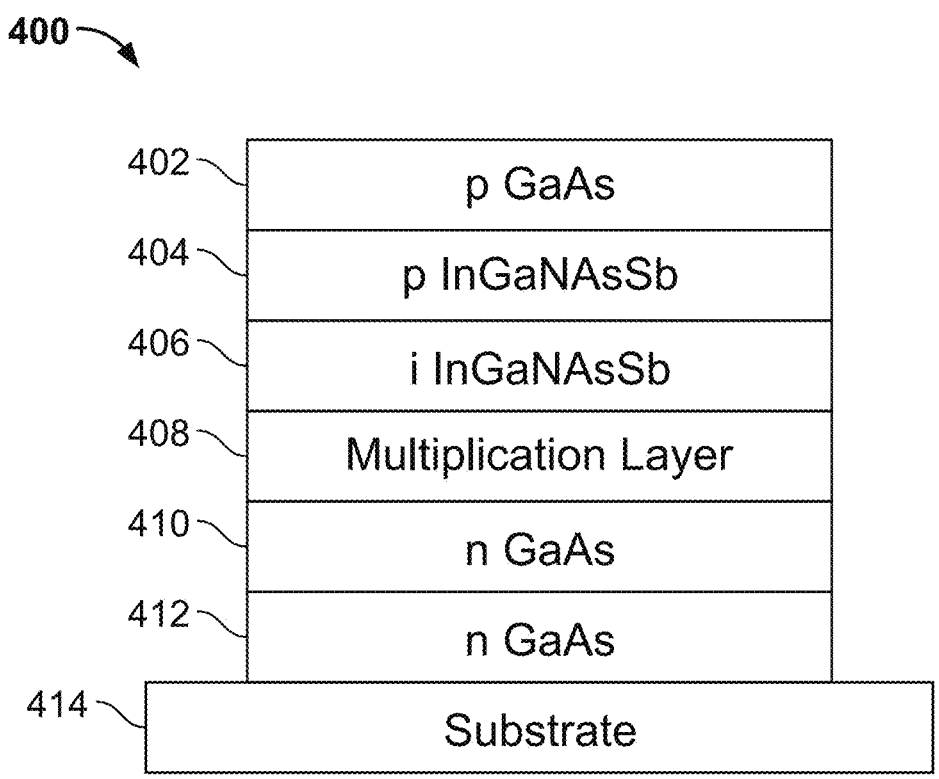
FIG. 4 depicts a semiconductor with a GaAs-based p-i-n diode and a multiplication layer, according to an illustrative implementation.

FIG. 4 depicts a semiconductor 400 with a GaAs-based p-i-n diode and a multiplication layer. The semiconductor 400 is similar to the semiconductor 300, but also includes an avalanche multiplication layer to amplify the photocurrent generated by the intrinsic layer of the p-i-n diode. The semiconductor 400 includes a substrate 414 with a top surface having a lattice parameter matching or nearly matching that of GaAs. The substrate 400 includes an n-type GaAs layer 412 epitaxially formed over the substrate 414, and an n-type GaAs layer 410 epitaxially formed over the n-type GaAs layer 412. The GaAs layer 412 can be more heavily doped than the GaAs layer 410. The semiconductor 400 also includes a multiplication layer 408 epitaxially formed over the GaAs layer 410, an intrinsic InGaNAsSb layer 406 epitaxially formed over the multiplication layer 408, a p-type InGaNAsSb layer 404 epitaxially formed over the intrinsic InGaNAsSb layer 406, and a p-type GaAs layer 402 epitaxially formed over the p-type InGaNAsSb layer 404. The p-type GaAs layer 402 can be more heavily doped than the p-type InGaNAsSb layer 404. The InGaNAsSb layer 404 and the InGaNAsSb layer 406 can each have the composition $In_xGa_{1-x}N_yAs_{1-y-z}Sb_z$ ($0 \leq x \leq 1$; $0 \leq y \leq 1$; $0 \leq z \leq 1$). The mole fractions x, y, and z can have different values in the different layers 402 and 404. In some examples, x ranges approximately from 0 to 0.55, inclusive, y ranges approximately from 0 to 0.1, inclusive, and z ranges approximately from 0 to 0.1, inclusive.

In some examples, the p-type GaAs layer 402 can have a thickness of approximately 0.2 μm and can be doped with Be or C to result in a free hole concentration of approximately $1.5 \times 10^{19}$ cm$^{-3}$. The p-type InGaNAsSb layer 404 can have a thickness of approximately 0.25 μm and can be doped with Be or C to result in a free hole concentration of approximately $7 \times 10^{18}$ cm$^{-3}$. The composition of the InGaNAsSb layer 404 can be selected to result in a bandgap of approximately 0.8 eV. The InGaNAsSb layer 406 can have a thickness of approximately 3 μm and can be unintentionally doped (UID) with a free carrier concentration of approximately $6 \times 10^{14}$ cm$^{-3}$. The InGaNAsSb layer 406 can act as an absorber layer to absorb incident photons. The InGaNAsSb layer 406 can have primarily holes as the free carriers, making the layer 406 p-type. The composition of the InGaNAsSb layer 406 can also be selected to result in a bandgap of approximately 0.8 eV. The InGaNAsSb layer 406 can have a bandgap between approximately 0.8 eV and approximately 0.95 eV, corresponding to wavelengths between 1.3 μm and 1.55 μm.

With the appropriate concentration of In, InGaAs alloys can have bandgaps within the wavelength range 1.3-1.55 μm. However, the lattice parameters of such InGaAs alloys are similar to that of InP, but not that of GaAs or Si. Thus, InGaAs absorbers are not readily compatible with epitaxial growth on GaAs or silicon substrates. However, the addition of N to InGaAs can reduce the bandgap while resulting in a lattice parameter that matches or nearly matches GaAs. Addition of Sb to InGaNAs results in improved crystallinity and lower background carrier concentration for a given bandgap. Sb can mitigate some defect types or can act as a surfactant to enhance device performance. Sb can improve the incorporation of N, allowing a lower N flux or flow to be used to grow a material of a given N concentration and correspondingly bandgap, thus reducing the background carrier concentration. Accordingly, the bandgap of InGaNAsSb can be tailored to the appropriate range while maintaining good crystallinity and lattice matching to GaAs.

The GaAs layer 410 can have a thickness of approximately 0.5 μm and can be doped with silicon to result in an n-type material with a free carrier concentration of approximately $2 \times 10^{15}$ cm$^{-3}$. The GaAs layer 412 can have a thickness of approximately 2.5 μm and can be doped with silicon to result in an n-type material with a free carrier concentration of approximately $5 \times 10^{18}$ cm$^{-3}$. The substrate 414 can include one or more layers, and the top surface of the substrate can have a lattice parameter matching or nearly matching GaAs. This results in a high quality interface between the GaAs layer 412 and the substrate 414, and reduces defect levels in the semiconductor 400. Some examples of the substrate 414 are described below with reference to FIG. 16. Accordingly, the semiconductor 400 includes a GaAs-based p-i-n diode that is optically active in the 1.3-1.55 μm range and is formed on the top surface of a substrate with a lattice parameter matching or nearly matching that of GaAs.

The multiplication layer 408 can be a p-type III-V layer that amplifies the current generated by the dilute nitride layer 406 through avalanche multiplication. One example of a p-type III-V layer is a p-type GaAs layer. For each free carrier (electron or hole) generated by the dilute nitride layer 406, the multiplication layer 408 generates one or more carriers via the avalanche effect. Thus, the multiplication layer 408 increases the total current generated by the semiconductor 400.

In some examples, the bandgap of one or more of the layers 106, 206, 304, 306, 404, and 406 is between 0.7 eV and 0.95 eV. In some examples, the bandgap of one or more of the layers 106, 206, 304, 306, 404, and 406 is 0.7 eV, 0.75 eV, 0.80 eV, 0.85 eV, 0.90 eV, or 0.95 eV. In some examples, one or more of the layers 106, 206, 304, 306, 404, and 406 is up to 10 μm thick. In some examples, one or more of the layers 106, 206, 304, 306, 404, and 406 is 0.001-1, 0.05-5, 0.5-5, 0.1-1, 1-10, 0.001-0.005, 0.005-0.01, 0.01-0.05, 0.05-0.1, 0.1-0.5, 0.5-1, 1-2, 2-3, 3-4, 4-5, 5-6, 6-7, 7-8, 8-9, 9-10, 2-10, 3-10, or 3-5 μm (micrometers) thick. The layers 106, 206, 306, and 406 have a free carrier concentration caused by unintentional dopants. The carrier concentration at room temperature of one or more of the layers 106, 206, 306, and 406 can be below approximately $1 \times 10^{16}$ cm$^{-3}$, can be below approximately $5 \times 10^{15}$ cm$^{-3}$, can be below approximately $1 \times 10^{15}$ cm$^{-3}$, and can be between approximately $1 \times 10^{13}$ cm$^{-3}$ and $5 \times 10^{15}$ cm$^{-3}$. Room temperature can include a range of temperatures that the layers 106, 206, 306, and 406 will experience during normal operation, such as approximately 20° C., between 15° C. and 25° C., between 0° C. and 30° C., and between −20° C. and 50° C. Because the layers 106, 206, 306, and 406 are unintentionally doped, carrier freeze-out will occur at higher temperatures than for semiconductors with higher doping levels. Because of this freeze-out effect, a sample measured at a reduced or cryogenic temperature will exhibit a lower carrier concentration than the same sample measured at room temperature. Thus, measuring carrier concentrations at room temperature provides an accurate indication of carrier concentrations to be expected during device operation, as opposed to measuring carrier concentrations at reduced or cryogenic temperatures.

One or more of the layers 106, 206, 304, 306, 404, and 406 can have In molar concentrations between approximately 10% and approximately 20%, N molar concentrations between approximately 3% and approximately 7%, and Sb molar concentrations between approximately 0.5% and approximately 5%.

Figure 5:
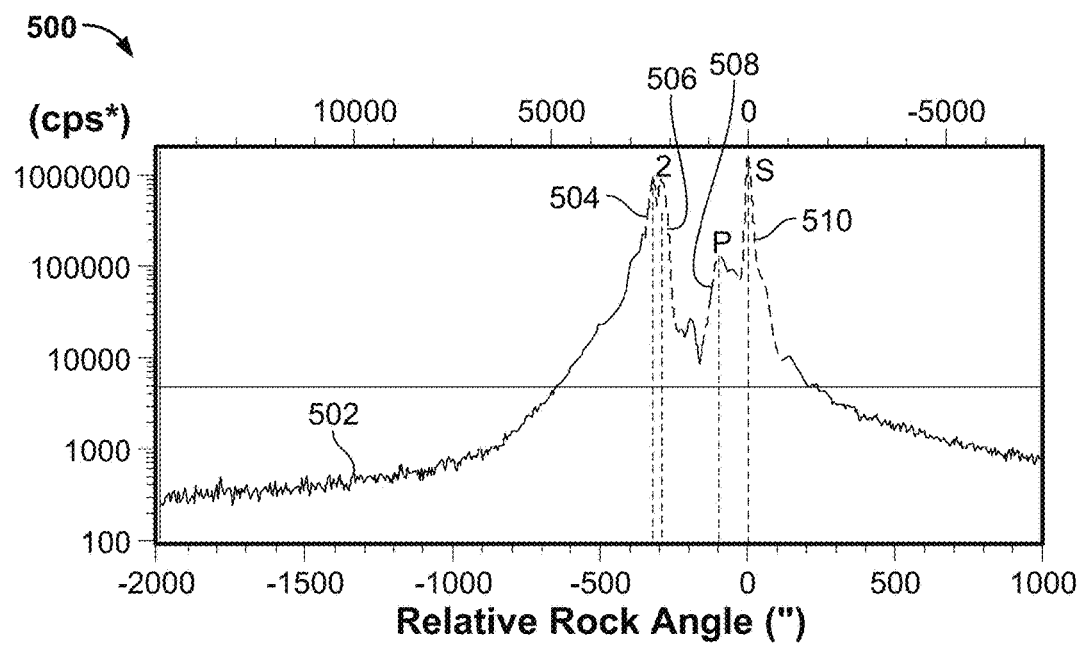
FIG. 5 depicts a graph that shows the characterization of the semiconductor shown in FIG. 3 by x-ray diffraction (XRD), according to an illustrative implementation.

FIG. 5 depicts a graph 500 that shows the characterization of the semiconductor 300 by x-ray diffraction (XRD). The graph 500 includes a scan 502 which has peaks 504, 506, 508, and 510. Each peak corresponds to a material of distinct lattice parameter. The peak 504 corresponds to the intrinsic InGaNAsSb layer 306, and peak 506 corresponds to the p-type InGaNAsSb layer 304. The p-type dopant adds tensile strain to the layer 304 and thus shifts the peak 506 away from the peak 504 by approximately 26 arc-seconds. Peak 508 may correspond to GaAsSb forming at the interface between the p-type GaAs layer 302 and the p-type InGaNAsSb layer 304. The peak 510 corresponds to the substrate 314. The narrowness of the peaks 504, 506, 508, and 510 indicates that the epitaxial layers 302, 304, 306, 310, and 312 have high crystallinity and low defect levels.

Figure 6:
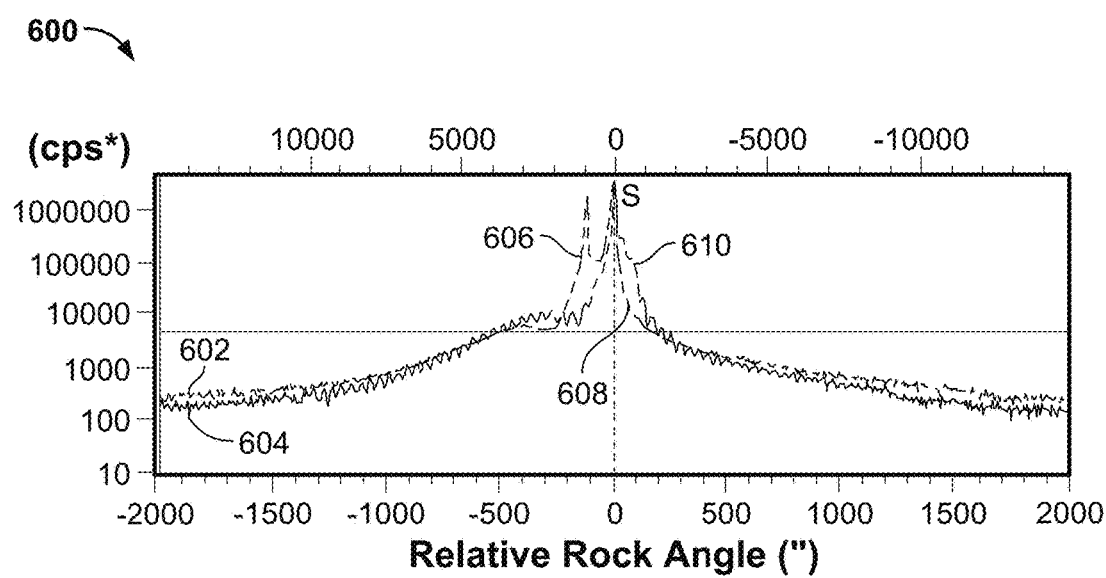
FIG. 6 depicts a graph that shows XRD scans of intrinsic InGaNAsSb layers of different thicknesses epitaxially formed on GaAs, according to an illustrative implementation.

FIG. 6 depicts a graph 600 that shows XRD scans of intrinsic InGaNAsSb layers of different thicknesses epitaxially formed on GaAs. The layers were grown using molecular beam epitaxy (MBE) at a growth temperature of 440° C. and a Group V element to Group III element ratio (V/III) of 42:1. These layers are coherently strained (non-relaxed) with a bandgap as low as 0.78 eV. The graph 600 includes a scan 602 of a 4 µm layer of InGaNAsSb and a scan 604 of a 0.5 µm layer of InGaNAsSb. The scan 602 has two peaks, 606 and 608, indicating the presence of two different lattice parameters. The peak 608 corresponds to the GaAs substrate, and the peak 606 corresponds to the 4 µm layer of InGaNAsSb. The peak 606 is shifted by −114 arcsec from the peak 608, indicating that the 4 µm layer of InGaNAsSb layer is slightly compressive as compared to GaAs. In contrast, the scan 604 only has one peak 610, indicating the presence of only one lattice parameter. The XRD peaks from the 0.5 µm layer of InGaNAsSb and the GaAs substrate overlap, indicating that the InGaNAsSb layer and the GaAs substrate are lattice matched or nearly matched. Furthermore, the narrowness of the peaks 606, 608, and 610 indicates that the InGaNAsSb layers have high crystallinity and low defect levels.

Figure 7:
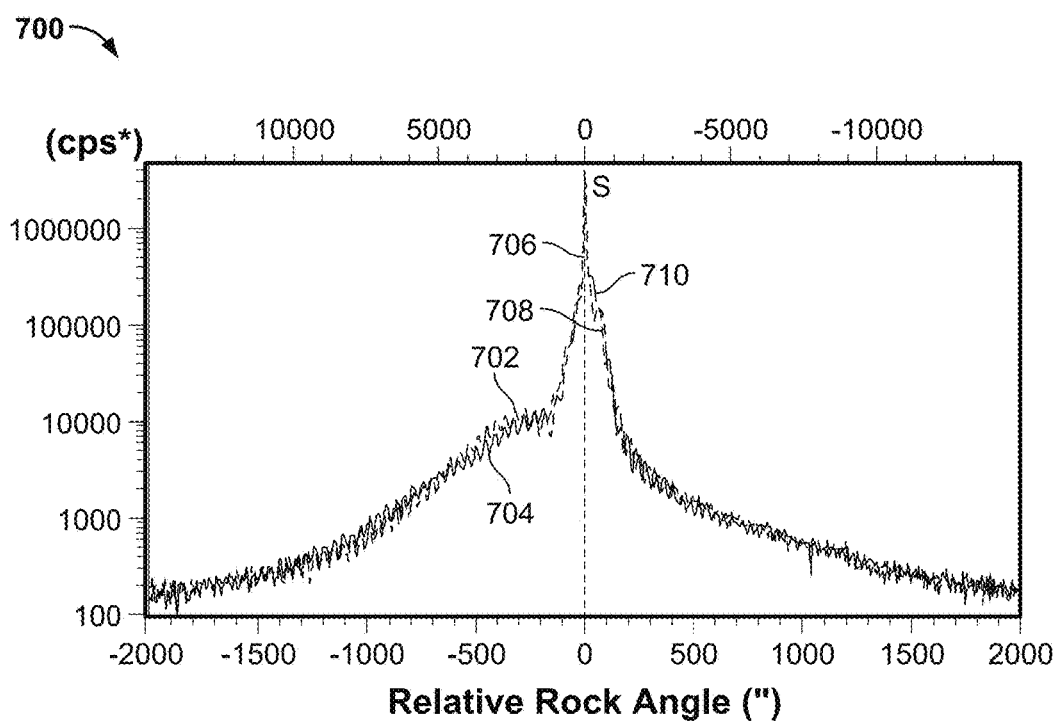
FIG. 7 depicts a graph that shows XRD scans of InGaNAsSb layers grown on p-type and semi-insulating GaAs substrates, according to an illustrative implementation.

FIG. 7 depicts a graph 700 that shows XRD scans of InGaNAsSb layers grown on p-type and semi-insulating GaAs substrates. The graph 700 includes a scan 702 of a 0.5 µm layer of InGaNAsSb grown by MBE on a p-type GaAs substrate and a scan 704 of a 0.5 µm layer of InGaNAsSb grown by MBE on a semi-insulating GaAs substrate.

Effective substrate temperature control can improve the quality of low-bandgap materials such as InGaNAsSb when grown on semi-insulating substrates. As the temperature of a semiconducting substrate is increased, free carriers are thermally generated and its absorption edge shifts to a lower energy. This shift can be measured and used to calculate substrate temperature.

Epitaxial growth systems are often heated using radiant heaters that rely on substrate radiant absorption to raise the temperature of the substrate. Absorption is a function of both doping and bandgap; more absorption occurs as bandgap decreases and/or as doping increases. Layer absorption also scales with layer thickness. As such, growth of a sufficiently thick low-bandgap material such as InGaNAsSb on a semi-insulating higher-bandgap material such as a GaAs substrate can result in a situation in which the low-bandgap material dominates radiant absorption. Changes in thickness of this low-bandgap material can thereby significantly affect the substrate temperature.

If a constant heater power which would result in a constant equilibrium temperature for a semi-insulating substrate is maintained while growing a sufficiently thick low-bandgap material, the increase in substrate absorptivity increases the amount of heat absorbed at the constant heater power, resulting in an increase in substrate temperature. Thus, both open-loop temperature control and closed-loop temperature control that is based on indirect measurements of the substrate temperature can be inaccurate when growing sufficiently thick low-bandgap materials on semi-insulating substrates. These effects are not as pronounced when growing low-bandgap materials on more conductive substrates, because doped substrate absorptivities are higher than those for semi-insulating substrates and tend to dominate radiant absorption.

The layer grown on a p-type substrate (scan 702) was grown with closed-loop temperature control that simply regulated the temperature of the substrate holder using a thermocouple positioned to be sensitive to the temperature of the substrate backside (opposite the epitaxial layer growth surface). However, the layer grown on a semi-insulating substrate (scan 704) was grown with modified closed-loop control. A feedback loop regulated the temperature of the substrate holder using the thermocouple and a first closed-loop control algorithm, but the temperature setpoint of the first closed-loop control algorithm was adjusted by a second closed-loop control algorithm. The second closed-loop control algorithm measured the substrate temperature using the temperature dependence of the substrate's optical absorption edge, and then adjusted the temperature setpoint of the first closed-loop control algorithm to maintain a constant substrate temperature. In this way, the modified closed-loop control algorithm maintained a constant substrate temperature despite changes in the absorptivity of the substrate.

The scan 702 includes a peak 710, and the scan 704 includes peaks 706 and 708. The peaks 706 and 710 are aligned, indicating that temperature was held constant with effective closed-loop control during the growth of the low-bandgap InGaNAsSb material. The peak 708 is a secondary peak on the scan 704, and is due to changes in composition resulting from temperature variations during initial growth of the InGaNAsSb layer. However, the scans 702 and 704 are well-matched, indicating that with effective temperature control, high-quality InGaNAsSb can be grown on a semi-insulating GaAs substrate.

Figure 8:
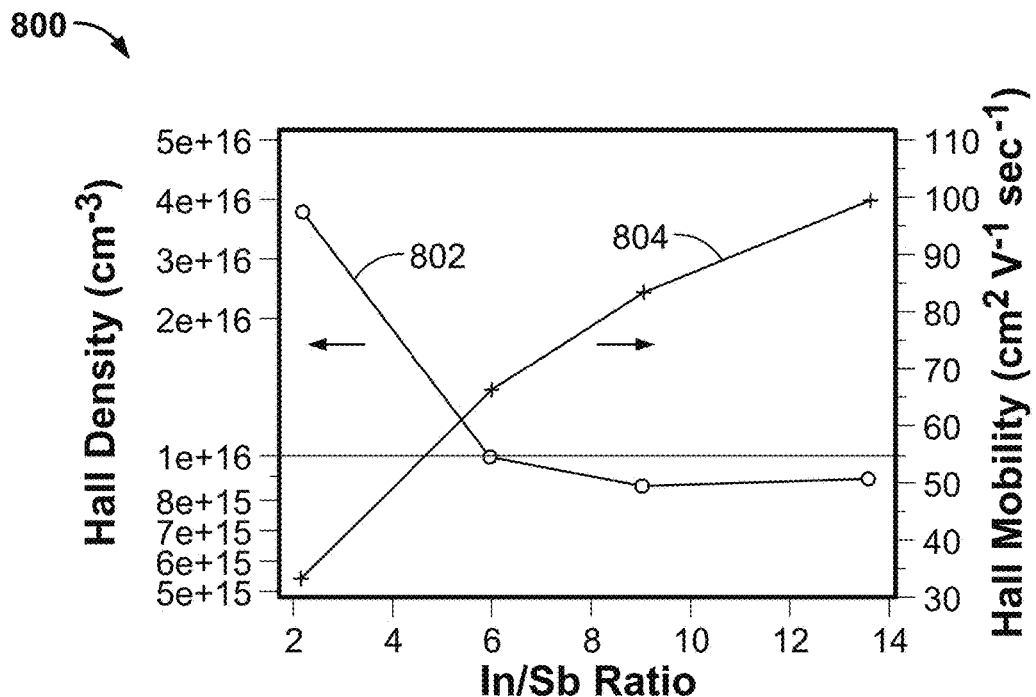
FIG. 8 depicts a graph showing the effect of the In/Sb ratio on carrier properties of InGaNAsSb, as measured by the Hall effect, according to an illustrative implementation.

FIG. 8 depicts a graph 800 showing the effect of the In/Sb ratio on carrier properties of InGaNAsSb, as measured by the Hall effect. The graph 800 includes a carrier concentration curve 802 and a carrier mobility curve 804. Decreasing In/Sb ratio during deposition below about 6 results in higher carrier concentration, as shown by the curve 802. Increasing the In/Sb ratio during deposition above about 6 does not significantly affect the carrier concentration, also shown by the curve 802. However, hole mobility, as measured by the Hall effect, increases consistently as the In/Sb ratio increases during deposition from 2 to 14, as shown by the curve 804.

Figure 9:
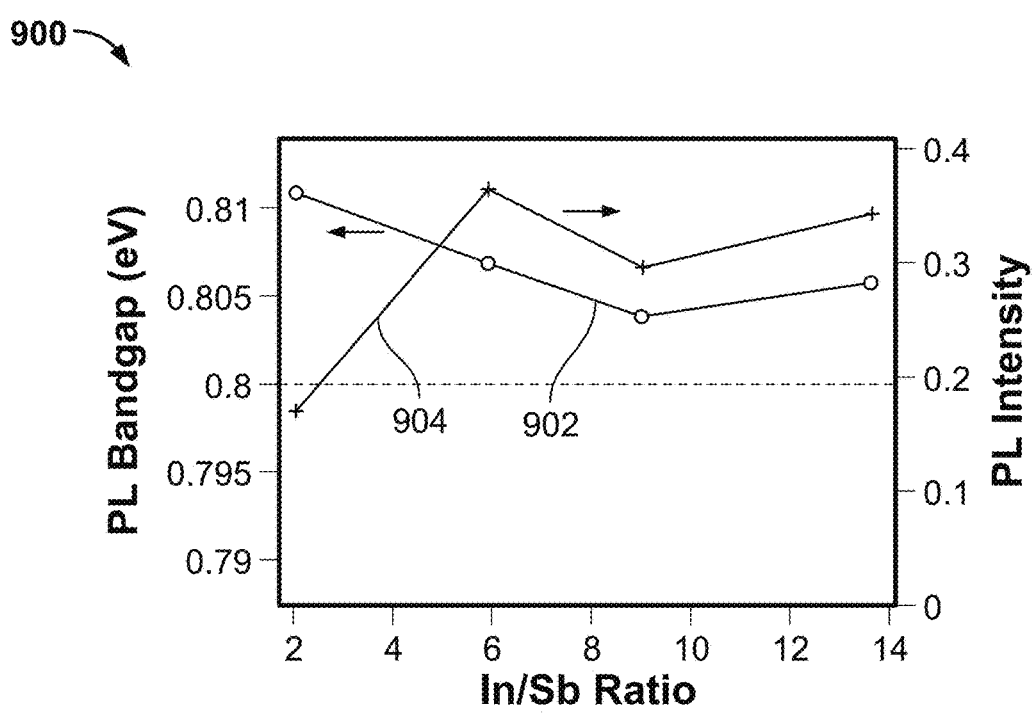
FIG. 9 depicts a graph showing the effect of the In/Sb ratio on optical properties of InGaNAsSb, as measured by photoluminescence (PL), according to an illustrative implementation.

FIG. 9 depicts a graph 900 showing the effect of the In/Sb ratio on optical properties of InGaNAsSb, as measured by photoluminescence (PL). The graph 900 includes a bandgap curve 902 and a PL intensity curve 904. The bandgap varies between approximately 0.811 eV and 0.803 eV as the In/Sb ratio varies between 2 and 14, with a minimum bandgap at an In/Sb ratio of 10. The PL intensity varies non-monotonically as the In/Sb ratio varies between 2 and 14, with a minimum at an In/Sb ratio of 2 and a maximum at an In/Sb ratio of 6. A higher PL intensity indicates a higher quality InGaNAsSb layer.

Lower In/Sb ratios result in lower bandgaps, which can be desirable for certain applications. However, decreasing the In/Sb ratio below about 6 can result in increases in background carrier concentration, which can result in increased dark current. When the InGaNAsSb material is used in p-i-n diodes as a photodetector, higher dark current can increase the background noise level, thus reducing the signal-to-noise level. Accordingly, it is desirable to decrease the bandgap while maintaining low background carrier concentrations.

Figure 10:
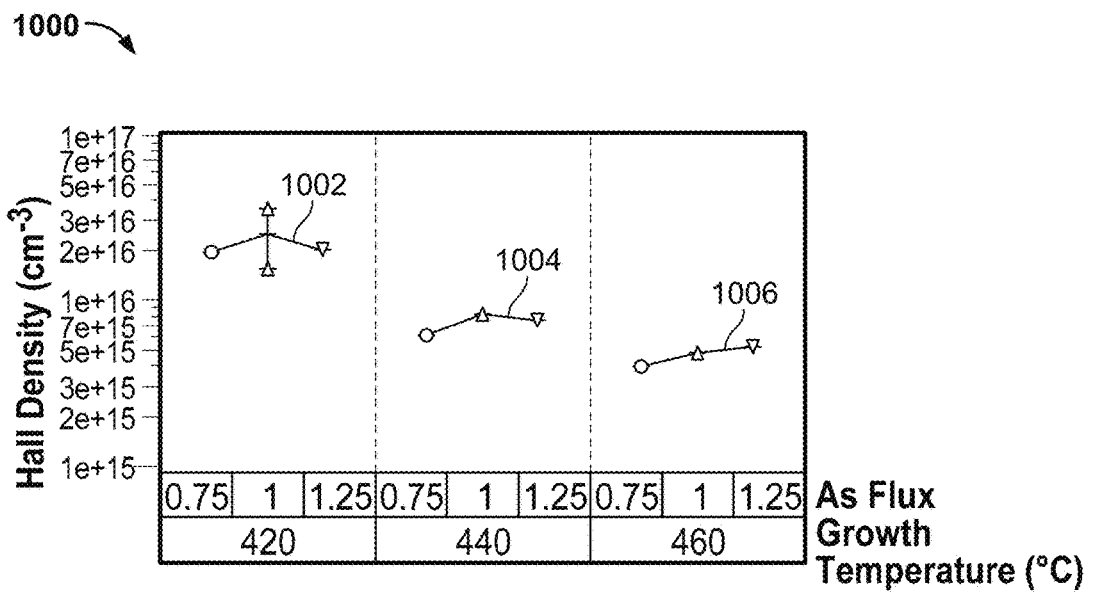
FIG. 10 depicts a graph that shows the effect of growth temperature and As flux on the carrier concentration of InGaNAsSb, as measured by the Hall effect, according to an illustrative implementation.

FIG. 10 depicts a graph 1000 that shows the effect of growth temperature and As flux on the carrier concentration of InGaNAsSb, as measured by the Hall effect. The graph 1000 includes curves 1002, 1004, and 1006, showing the effect of 25% increases and 25% decreases in As flux on carrier concentration at growth temperatures (i.e., substrate temperatures during growth) of 420° C., 440° C., and 460° C., respectively. Higher growth temperatures result in lower background carrier concentrations. In this study, a growth temperature of 460° C. resulted in a background carrier concentration of approximately $4 \times 10^{15}$ cm$^{-3}$, as shown by the curve 1006. The As flux has a smaller impact on the background carrier concentration, but in general, a lower As flux results in a lower background carrier concentration, as shown by the curves 1004 and 1006.

Figure 11:
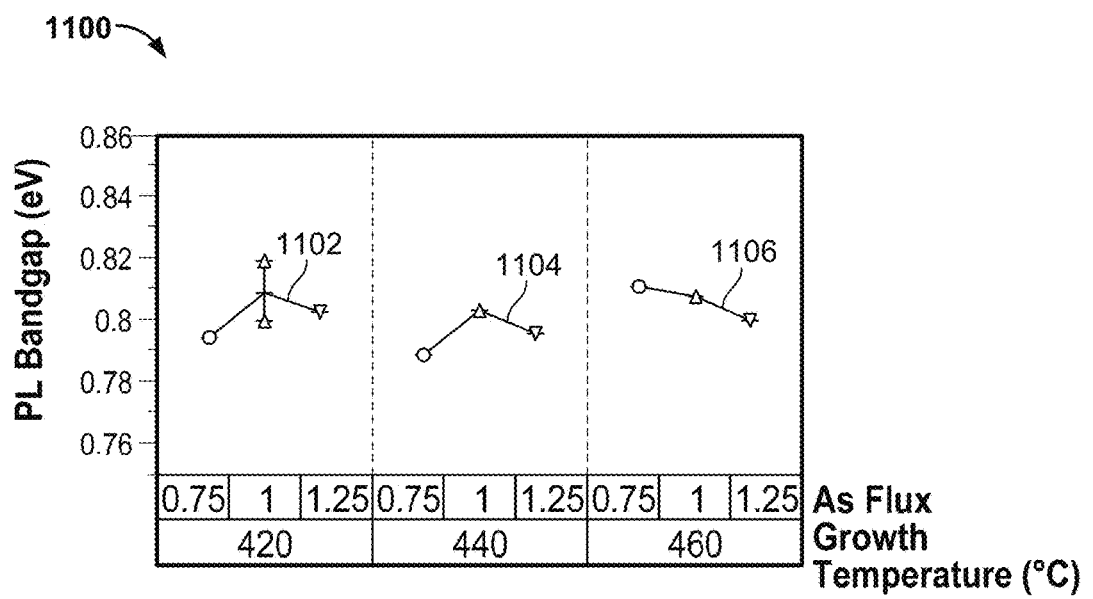
FIG. 11 depicts a graph that shows the effect of growth temperature and arsenic flux on the bandgap of InGaNAsSb, as measured by photoluminescence, according to an illustrative implementation.

FIG. 11 depicts a graph 1100 that shows the effect of growth temperature and arsenic flux on the bandgap of InGaNAsSb, as measured by photoluminescence. The graph 1100 includes curves 1102, 1104, and 1106, showing the effect of 25% increases and 25% decreases in As flux on bandgap at growth temperatures of 420° C., 440° C., and 460° C., respectively. The bandgap of InGaNAsSb exhibits only a weak dependence on growth temperature between 420° C. and 460° C., ranging from a low of 0.79 eV to a high of 0.82 eV. The bandgap of InGaNAsSb also exhibits a weak dependence on As flux, with an As flux of 1 (nominal value) generally resulting in the highest bandgap within the range of fluxes in this study.

Figure 12:
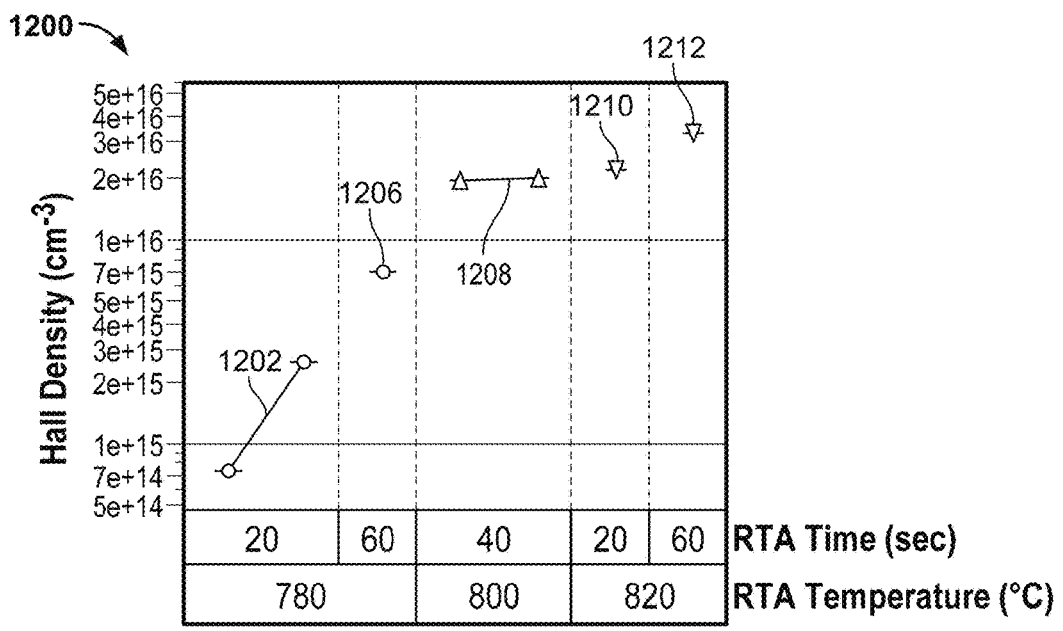
FIG. 12 depicts a graph showing the effect of rapid thermal annealing (RTA) on the carrier concentration of InGaNAsSb, as measured by the Hall effect, according to an illustrative implementation.

FIG. 12 depicts a graph 1200 showing the effect of rapid thermal annealing (RTA) on the carrier concentration of InGaNAsSb, as measured by the Hall effect. The graph 1200 includes curves 1202 and 1206 corresponding to an RTA temperature of 780° C., curve 1208 corresponding to an RTA temperature of 800° C., and curves 1210 and 1212 corresponding to an RTA temperature of 820° C. In general, short anneals of InGaNAsSb at lower temperatures result in lower background carrier concentrations, within the RTA parameters examined in the study. For a given RTA temperature, a shorter RTA duration resulted in a lower carrier concentration, as shown by curves 1202, 1206, 1210, and 1212. For a given RTA duration, a lower RTA temperature resulted in a lower carrier concentration, as shown by curves 1202, 1206, 1210, and 1212. The reduction in carrier concentration with RTA temperature is especially significant. Decreasing the RTA temperature from 820° C. to 780° C. reduces the carrier concentration from $3 \times 10^{16}$ cm$^{-3}$ (curve 1212) to $7 \times 10^{14}$ cm$^{-3}$ (curve 1202), a decrease of more than an order of magnitude.

Figure 13:
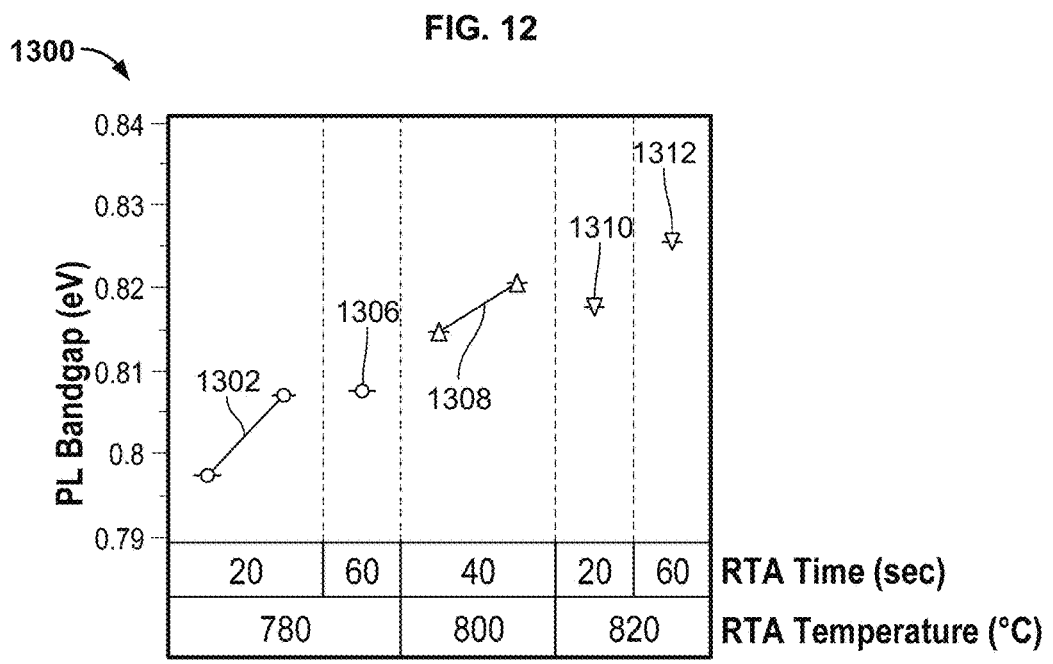
FIG. 13 includes a graph showing the effect of RTA on the bandgap of InGaNAsSb as measured by photoluminescence, according to an illustrative implementation.

FIG. 13 includes a graph 1300 showing the effect of RTA on the bandgap of InGaNAsSb as measured by photoluminescence. The graph 1300 includes curves 1302 and 1306 corresponding to an RTA temperature of 780° C., curve 1308 corresponding to an RTA temperature of 800° C., and curves 1310 and 1312 corresponding to an RTA temperature of 820° C. The effects of RTA on bandgap are similar to the effects on carrier concentration. For a given RTA temperature, a shorter RTA duration resulted in a lower bandgap, as shown by curves 1302, 1306, 1310, and 1312. For a given RTA duration, a lower RTA temperature resulted in a lower bandgap, as shown by curves 1302, 1306, 1310, and 1312. Decreasing the RTA temperature from 820° C. to 780° C. reduces the bandgap from approximately 0.81 eV (curve 1312) to approximately 0.797 eV (curve 1302).

Figure 14:
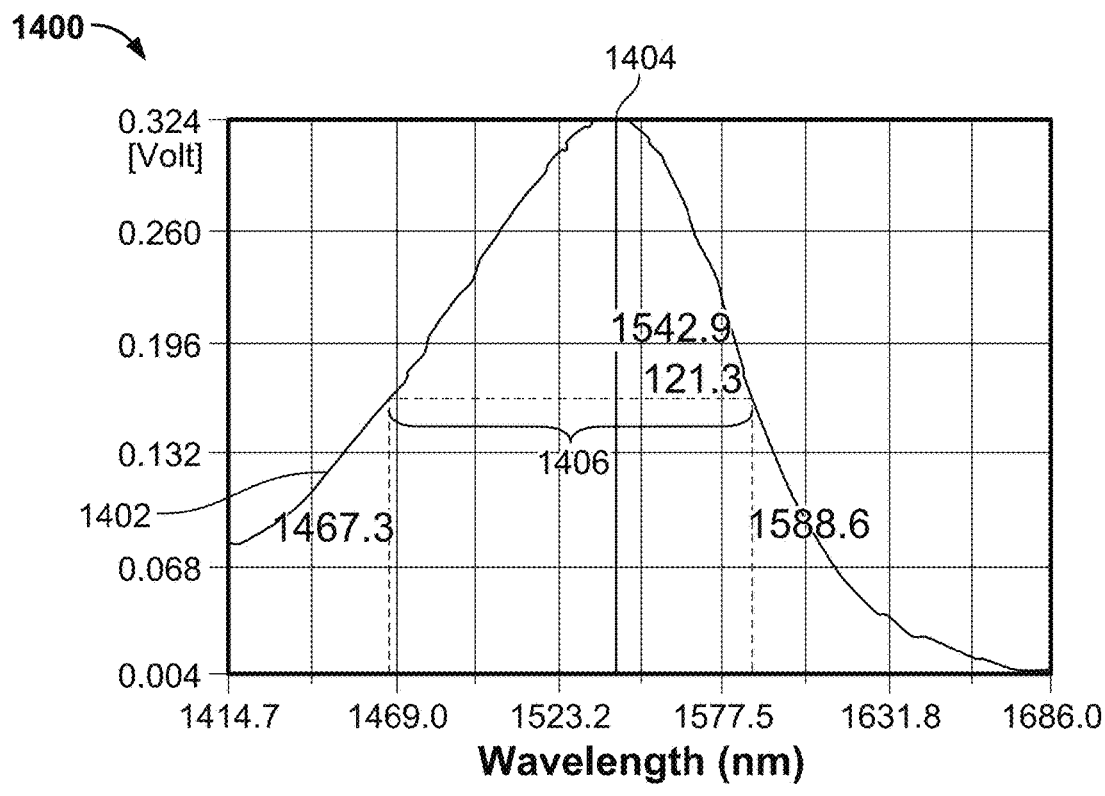
FIG. 14 depicts a graph that shows a photoluminescence spectrum of a 0.5 μm layer of InGaNAsSb grown on a GaAs substrate, according to an illustrative implementation.

FIG. 14 depicts a graph 1400 that shows a photoluminescence spectrum of a 0.5 µm layer of InGaNAsSb grown on a GaAs substrate. The graph 1400 includes a scan 1402 that was measured on a 0.5 µm layer of InGaNAsSb grown on a GaAs substrate. The scan 1402 includes a peak 1404 at a wavelength of 1.5429 µm, corresponding to an energy of 0.8036 eV. The scan 1402 includes a full width at half maximum 1406 of 121.3 nm, a narrow width that indicates good material quality.

Figure 15:
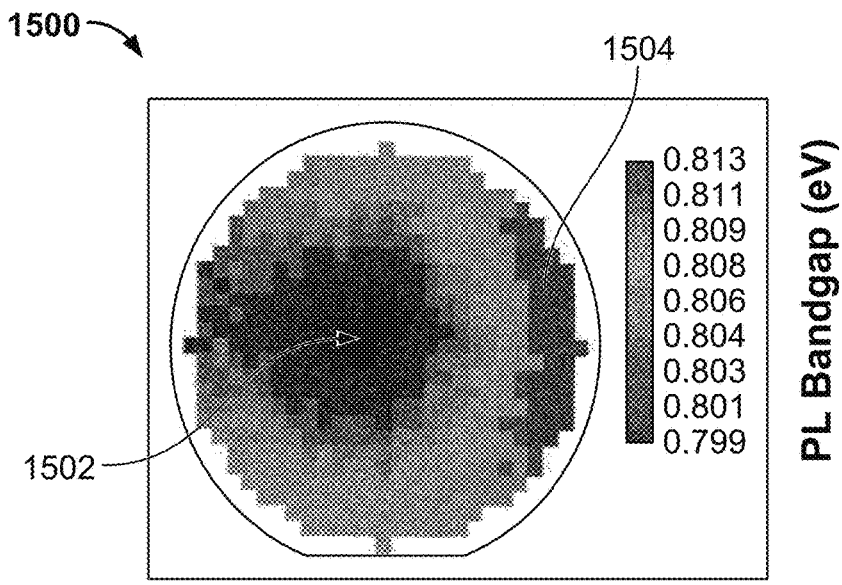
FIG. 15 includes a colormap that shows cross-wafer variation in bandgap of a 0.5 μm layer of InGaNAsSb grown on a 150 mm GaAs substrate, according to an illustrative implementation.

FIG. 15 includes a colormap 1500 that shows cross-wafer variation in bandgap of a 0.5 µm layer of InGaNAsSb grown on a 150 mm GaAs substrate. The bandgap of the layer ranges between a minimum value of 0.799 eV at a center location 1502 and a maximum value of 0.813 eV at an edge location 1504. The average bandgap is 0.806 eV, and the standard deviation is 0.408%, or approximately 0.003 eV.

These variations can be due to variations in precursor flow, substrate temperature, and/or other factors. However, the variations are relatively small and illustrate that the uniformity is good.

Figure 16:
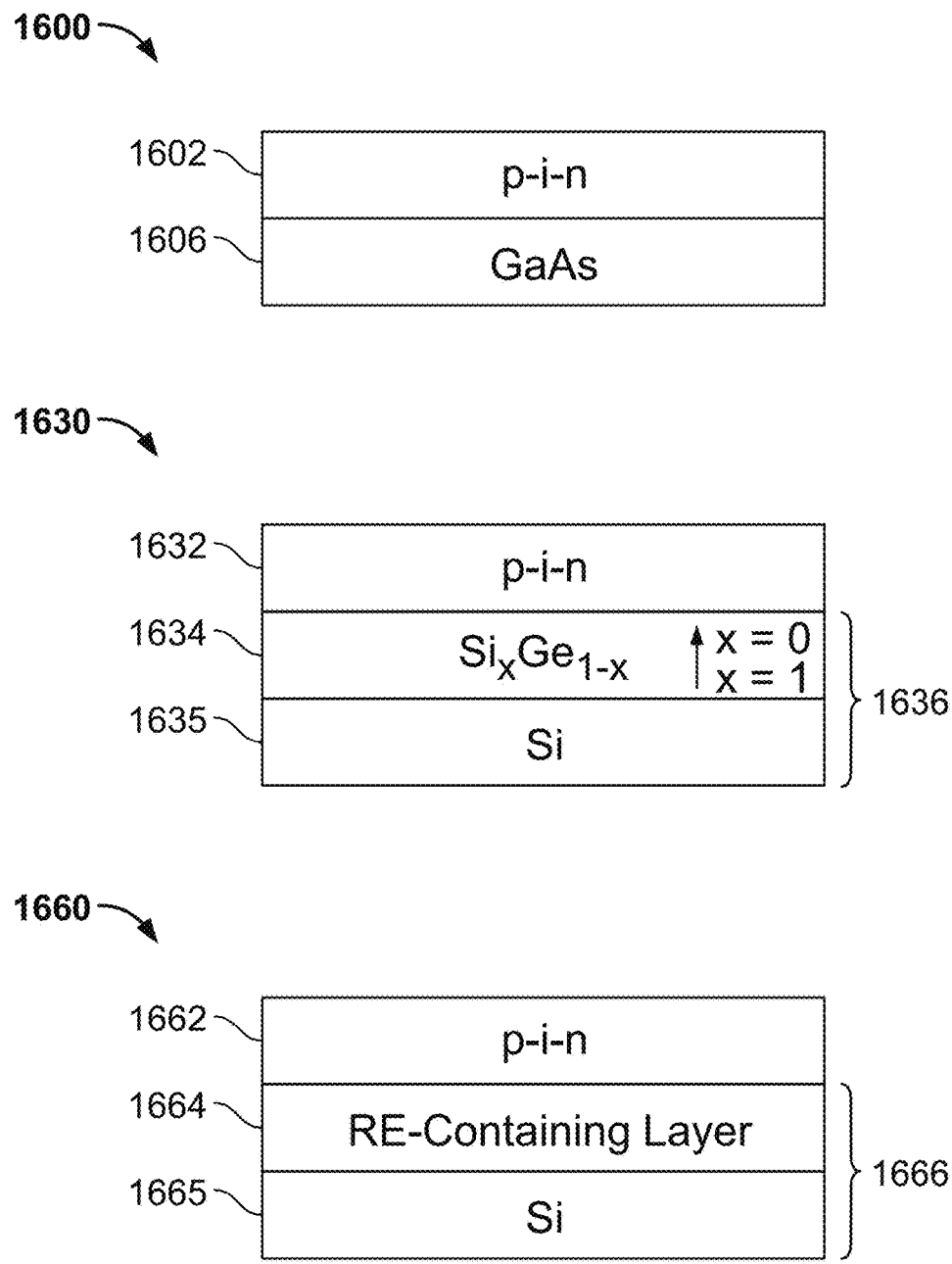
FIG. 16 illustrates several examples of p-i-n diodes formed over substrates with lattice parameters matching or nearly matching GaAs, according to an illustrative implementation.

FIG. 16 illustrates several examples of p-i-n diodes formed over substrates with lattice parameters matching or nearly matching GaAs. FIG. 16 depicts semiconductors 1600, 1630, and 1660. The semiconductor 1600 includes a p-i-n diode 1602 epitaxially formed over a GaAs substrate 1606. The GaAs substrate 1606 thus provides an ideal substrate for homoepitaxy of a Ga—As-based p-i-n structure such as the p-i-n diode 1602. The substrate 1606 can include any of the substrates 114, 214, 314, and 414. The p-i-n diode 1602 can include any of the p-i-n diode comprising the layers 102, 106, and 112; the p-i-n diode comprising the layers 202, 206, 208, and 212; the p-i-n diode comprising the layers 302, 304, 306, 310, and 312; and the p-i-n diode comprising the layers 402, 404, 406, 408, 410, and 412.

The semiconductors 1630 and 1660 each include a lattice engineered layer over a silicon substrate. Each lattice engineered layer has a first surface nearest the silicon substrate and a second (top-most) surface opposite the silicon substrate. The first surface nearest the silicon substrate has a lattice parameter that is matched or nearly matched to that of Si. This results in a low number of defects and/or dislocations in the lattice engineered layer. The semiconductors 1630 and 1660 can include one or more layers (not shown) between the lattice engineered layer and the silicon substrate. The second surface opposite the silicon substrate has a lattice parameter that is matched or nearly matched to that of GaAs. This results in a low number of defects and/or dislocations when epitaxially growing p-i-n layers and/or dilute nitride layers that have lattice constants that are matched or nearly matched to that of GaAs. A low number of defects can include comparable or fewer defects than would occur in an In$_{0.53}$Ga$_{0.47}$As layer grown on an InP substrate.

The semiconductor 1630 includes a graded Si$_x$Ge$_{1-x}$ (0≤x≤1) layer 1634 formed over a Si substrate 1635. The graded Si$_x$Ge$_{1-x}$ layer 1634 is a lattice engineered layer. The semiconductor 1630 also includes a p-i-n diode 1632 epitaxially formed over the graded Si$_x$Ge$_{1-x}$ layer 1634. The Si fraction x of the graded Si$_x$Ge$_{1-x}$ layer 1634 varies from 0 to 1 through its thickness. At the interface with the Si substrate 1635, x=1 and the graded Si$_x$Ge$_{1-x}$ layer 1634 substantially only contains Si. At the interface with the p-i-n diode 1632, x=0 and the graded Si$_x$Ge$_{1-x}$ layer 1634 substantially only contains Ge. Thus, the graded Si$_x$Ge$_{1-x}$ layer 1634 provides a transition in lattice parameter from that of the Si substrate (5.43 Å) to that of Ge (5.66 Å), which nearly matches to that of GaAs (5.65 Å). The lattice constants of Ge and GaAs are matched well enough that high-quality GaAs can be epitaxially grown on a Ge surface. Thus, the graded Si$_x$Ge$_{1-x}$ layer 1634 allows growth of GaAs layers on Si substrates. Together, the graded Si$_x$Ge$_{1-x}$ layer 1634 and the silicon substrate 1635 comprise a substrate 1636 having a top surface with a lattice parameter nearly matching GaAs. The substrate 1636 can include any of the substrates 114, 214, 314, and 414. The p-i-n diode 1632 can include any of the p-i-n diode comprising the layers 102, 106, and 112; the p-i-n diode comprising the layers 202, 206, 208, and 212; the p-i-n diode comprising the layers 302, 304, 306, 310, and 312; and the p-i-n diode comprising the layers 402, 404, 406, 408, 410, and 412.

The semiconductor 1660 includes a rare earth (RE) containing layer 1664 epitaxially formed over a silicon substrate 1665. The RE containing layer 1664 is a lattice engineered layer. Rare earth elements are a specific class of elements on the periodic table (Sc, Y, La, Ce, Pr, Nd, Pm, Sm, Eu, Gd, Tb, Dy, Ho, Er, Tm, Yb, Lu). The RE containing layer can contain one or more of the rare earth elements. The semiconductor 1660 also includes a p-i-n diode 1662 epitaxially formed over the RE containing layer 1664. Generically, the RE containing layer can be a rare earth oxide (REO), a rare earth silicide (RESi), or a pnictide (RE-V, where V represents a group V element from the periodic chart, namely N, P, As, Sb, or Bi) or any combination of REO, RESi, and/or pnictide. The composition of the RE containing layer can be selected to result in a lattice parameter matching or nearly matching GaAs at its interface with the p-i-n diode 1662. For example, the layer at the interface could be $ErAs_xN_{1-x}$, where x is approximately 0.9, which is lattice matched or nearly matched to GaAs. The rare earth containing layer can be of constant composition or graded throughout its thickness. When graded, the layer can be engineered so that the portion nearest the Si is chemically and mechanically compatible with silicon. For example, gadolinium oxide could be employed at or near the interface between the silicon and rare earth containing layer due to its lattice match with silicon. Thus, the RE containing layer 1664 provides a template for epitaxial growth of the p-i-n diode 1662. Together, the RE containing layer 1664 and the silicon substrate 1665 comprise a substrate 1666 having a top surface with a lattice parameter matching or nearly matching GaAs.

The substrate 1666 can include any of the substrates 114, 214, 314, and 414. The p-i-n diode 1662 can include any of the p-i-n diode comprising the layers 102, 106, and 112; the p-i-n diode comprising the layers 202, 206, 208, and 212; the p-i-n diode comprising the layers 302, 304, 306, 310, and 312; and the p-i-n diode comprising the layers 402, 404, 406, 408, 410, and 412.

FIGS. 1-4 depict p-i-n structures with an n-type layer over a substrate, an optional multiplication layer over the n-type layer, an intrinsic absorber layer over the n-type layer or the optional multiplication layer, and a p-type layer over the intrinsic absorber layer. In some examples, however, the order of the layers may be different. For example, the p-type layer may be over the substrate, the intrinsic absorber layer may be over the p-type layer, and the n-type layer may be over the intrinsic absorber layer. In addition, a multiplication layer may optionally be included, either between either the p-type layer and the intrinsic absorber layer or between the intrinsic absorber layer and the n-type layer. The substrates depicted in FIGS. 1-4 and 16 may be n-type, p-type, highly doped, unintentionally doped, insulating, conducting, or a combination of these.

The layers of the semiconductors 100, 200, 300, 400, 1600, 1700, and 1800 can be epitaxially formed with semiconductor processing techniques such as molecular beam epitaxy (MBE), metalorganic chemical vapor deposition (MOCVD), halide vapor phase epitaxy (HYPE), physical vapor deposition (PVD), and/or sputtering. All of the layers of a semiconductor can be formed in a single chamber, or different layers of a semiconductor can be formed in different chambers. For example, epitaxial layers of the substrates 114, 214, 314, 414 1606, 1636, and 1666 can be formed in a different chamber than epitaxial layers of the corresponding p-i-n diodes. The semiconductors 100, 200, 300, 400, 1600, 1700, and 1800 are then laterally patterned using photolithography, etching, and metal deposition techniques to produce detectors.

From the above description of the method it is manifest that various techniques may be used for implementing the concepts of the method without departing from its scope. The described embodiments are to be considered in all respects as illustrative and not restrictive. It should also be understood that the method is not limited to the particular examples described herein, but can be implemented in other examples without departing from the scope of the claims. A first layer described and/or depicted herein as over a second layer can be immediately adjacent to the second layer, or one or more intermediate layers can be between the first and second layers. Similarly, while operations are depicted in the drawings in a particular order, this should not be understood as requiring that such operations be performed in the particular order shown or in sequential order, or that all illustrated operations be performed, to achieve desirable results.

What is claimed is:

1. A semiconductor, comprising:
   a substrate with a lattice parameter matching or nearly matching GaAs;
   a first doped III-V layer over the substrate;
   an absorber layer over the first doped III-V layer, the absorber layer having:
      a dilute nitride comprising $In_xGa_{1-x}N_yAs_{1-y-z}Sb_z$ ($0 \leq x \leq 1$; $0 \leq y \leq 0.1$; $0 < z \leq 0.1667$),
      an In/Sb ratio of at least approximately 6,
      a bandgap between approximately 0.7 eV and 0.95 eV, and
      a carrier concentration less than approximately $1 \times 10^{16}$ cm$^{-3}$ at room temperature; and
   a second doped III-V layer over the absorber layer.

2. The semiconductor of claim 1 wherein the dilute nitride comprises $In_xGa_{1-x}N_yAs_{1-y-z}Sb_z$ ($0 \leq x \leq 0.55$; $0 < y \leq 0.1$; $0 < z \leq 0.1$).

3. The semiconductor of claim 1, wherein the carrier concentration of the absorber layer is less than approximately $5 \times 10^{15}$ cm$^{-3}$.

4. The semiconductor of claim 1, wherein the carrier concentration of the absorber layer is less than approximately $1 \times 10^{15}$ cm$^{-3}$.

5. The semiconductor of claim 1, wherein a thickness of the absorber layer is between approximately 2 micrometers and approximately 10 micrometers.

6. The semiconductor of claim 1, wherein a thickness of the absorber layer is between approximately 3 micrometers and approximately 5 micrometers.

7. The semiconductor of claim 1, further comprising a multiplication layer between the absorber layer and one of the first and second doped III-V layers.

8. The semiconductor of claim 1, wherein the substrate comprises GaAs.

9. The semiconductor of claim 1, wherein the first doped III-V layer is n-type and the second doped III-V layer is p-type.

10. The semiconductor of claim 1, wherein the first doped III-V layer is p-type and the second doped III-V layer is n-type.

11. The semiconductor of claim 1, wherein the absorber layer is p-type.

12. The semiconductor of claim 1, wherein the substrate comprises:
   a silicon substrate; and
   a lattice engineered layer over the silicon substrate, the surface of the lattice engineered layer opposite the silicon substrate having a lattice parameter that is matched or nearly matched to GaAs.

13. The semiconductor of claim 12, wherein the lattice engineered layer comprises a $Si_xGe_{1-x}$, layer, with x graded from 1 at a surface of the $Si_xGe_{1-x}$ layer nearest the silicon substrate to 0 at a surface of the $Si_xGe_{1-x}$ layer opposite the silicon substrate.

14. The semiconductor of claim 12, wherein the lattice engineered layer comprises a rare earth containing layer, the rare earth containing layer comprising one or more of Sc, Y, La, Ce, Pr, Nd, Pm, Sm, Eu, Gd, Tb, Dy, Ho, Er, Tm, Yb, and/or Lu.

15. A method of forming a semiconductor, comprising:
forming a first doped III-V layer over a substrate with a lattice parameter matching or nearly matching GaAs;
forming an absorber layer over the first doped III-V layer, the absorber layer having:
a dilute nitride comprising $In_xGa_{1-x}N_yAs_{1-y-z}Sb_z$ ($0 \leq x \leq 1$; $0 < y \leq 0.1$; $0 < z \leq 0.1667$),
an In/Sb ratio of at least approximately 6,
a bandgap between approximately 0.7 eV and 0.95 eV, and
a carrier concentration less than approximately $1 \times 10^{16}$ cm$^{-3}$ at room temperature; and
forming a second doped III-V layer over the absorber layer.

16. The method of claim 15, wherein the dilute nitride comprises $In_xGa_{1-x}N_yAs_{1-y-z}Sb_z$ ($0 \leq x \leq 0.55$; $0 < y \leq 0.1$; $0 < z \leq 0.1$).

17. The method of claim 15, wherein the carrier concentration of the absorber layer is less than approximately $5 \times 10^{15}$ cm$^{-3}$.

18. The method of claim 15, wherein the carrier concentration of the absorber layer is less than approximately $1 \times 10^{15}$ cm$^{-3}$.

19. The method of claim 15, wherein a thickness of the absorber layer is between approximately 2 micrometers and approximately 10 micrometers.

20. The method of claim 15, wherein a thickness of the absorber layer is between approximately 3 micrometers and approximately 5 micrometers.

21. The method of claim 15, further comprising forming a multiplication layer between the absorber layer and one of the first and second doped III-V layers.

22. The method of claim 15, wherein the substrate comprises GaAs.

23. The method of claim 15, wherein the first doped III-V layer is n-type and the second doped III-V layer is p-type.

24. The method of claim 15, wherein the first doped III-V layer is p-type and the second doped III-V layer is n-type.

25. The method of claim 15, wherein the absorber layer is p-type.

26. The method of claim 15, wherein the substrate comprises:
a silicon substrate; and
a lattice engineered layer over the silicon substrate, the surface of the lattice engineered layer opposite the silicon substrate having a lattice parameter that is matched or nearly matched to GaAs.

27. The method of claim 26, wherein the lattice engineered layer comprises a $Si_xGe_{1-x}$ layer, with x graded from 1 at a surface of the $Si_xGe_{1-x}$ layer nearest the silicon substrate to 0 at a surface of the $Si_xGe_{1-x}$ layer opposite the silicon substrate.

28. The method of claim 26, wherein the lattice engineered layer comprises a rare earth containing layer, the rare earth containing layer comprising one or more of Sc, Y, La, Ce, Pr, Nd, Pm, Sm, Eu, Gd, Tb, Dy, Ho, Er, Tm, Yb, and/or Lu.

* * * * *